United States Patent
Langgood et al.

(10) Patent No.: US 7,983,770 B2
(45) Date of Patent: Jul. 19, 2011

(54) EXTERNAL AMBIENT NOISE MONITORING TO ADAPT CONTROL OF INTERNAL SYSTEM NOISE SOURCES

(75) Inventors: John K. Langgood, Cary, NC (US); Thomas F. Lewis, Raleigh, NC (US); Kevin M. Reinberg, Chapel Hill, NC (US); Kevin S. Vernon, Durham, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 274 days.

(21) Appl. No.: 11/742,583

(22) Filed: Apr. 30, 2007

(65) Prior Publication Data
US 2008/0269920 A1    Oct. 30, 2008

(51) Int. Cl.
G05B 13/02 (2006.01)
G06F 15/00 (2006.01)
G06F 1/00 (2006.01)
G06F 1/04 (2006.01)
G06F 11/00 (2006.01)
H04B 15/00 (2006.01)

(52) U.S. Cl. .......... 700/34; 702/127; 702/191; 713/340; 713/503; 713/600

(58) Field of Classification Search .......... None
See application file for complete search history.

(56) References Cited

U.S. PATENT DOCUMENTS

| | | | | |
|---|---|---|---|---|
| 5,566,339 | A * | 10/1996 | Perholtz et al. | 713/340 |
| 5,828,768 | A * | 10/1998 | Eatwell et al. | 381/333 |
| 6,134,667 | A * | 10/2000 | Suzuki et al. | 713/300 |
| 6,494,381 | B2 * | 12/2002 | Bulthuis | 236/49.3 |
| 6,643,128 | B2 * | 11/2003 | Chu et al. | 361/679.48 |
| 6,922,787 | B2 * | 7/2005 | Karpel et al. | 713/320 |
| 6,988,048 | B2 * | 1/2006 | Lin | 702/132 |
| 7,028,211 | B2 * | 4/2006 | Mantani | 713/600 |
| 7,489,092 | B1 * | 2/2009 | Larky et al. | 318/34 |
| 2002/0079375 | A1 * | 6/2002 | Bulthuis | 236/49.3 |
| 2002/0079746 | A1 * | 6/2002 | Hashimoto | 307/149 |
| 2002/0093788 | A1 * | 7/2002 | Rothschild | 361/685 |
| 2002/0140389 | A1 * | 10/2002 | Ohki et al. | 318/471 |
| 2003/0011984 | A1 * | 1/2003 | Chu et al. | 361/687 |
| 2003/0226049 | A1 * | 12/2003 | Mantani | 713/322 |

* cited by examiner

*Primary Examiner* — Ramesh B Patel
*Assistant Examiner* — Sunray R Chang
(74) *Attorney, Agent, or Firm* — Ference & Associates LLC

(57) ABSTRACT

An arrangement for controlling a system generated noise level such that the same is adapted to an actual ambient noise level of the system environment. Internal noise generators will thus not run at a needlessly lowered rate than actually needed. For instance, by permitting a fan to run at a generally higher speed, the system will not needlessly undergo significant internal temperature increases. By the same token, CPU performance, to the extent that it represents a noise generator, will not be needlessly throttled.

18 Claims, 7 Drawing Sheets

```
PSEUDO CODE

START
    CPU_TEMP = MEASURE CPU_TEMPERATURE;
    EXTERNALSOUND = MEASURE EXTERNAL SOUND;
    SYSTEMNOISE = LOOK-UP TABLE OF NOISE PROFILE (MEASURE FAN SPEED);

IF (CPU_TEMPERATURE = LOW)
    {
        // SET INITIAL CONDITIONS
        FAN SPEED = LOW;
        CPU_THROTTLING = OFF;
    }

IF (CPU_TEMPERATURE = INCREASING)
    {
        IF (SYSTEMNOISE < EXTERNALSOUND) INCREASE FAN SPEED ONE INCREMENT;
        ELSE IF (CPU_THROTTLING < MAXIMUM) INCREASE CPU_THROTTLING ONE INCREMENT;
        ELSE IF (FAN SPEED < MAX)
        {
            IF (CPU THROTTLING = MAXIMUM) INCREASE FAN SPEED ONE INCREMENT;
        }
    }

IF (CPU_TEMPERATURE = DECREASING)
    {
        IF (SYSTEMNOISE > EXTERNALSOUND) DECREASE FAN SPEED ONE INCREMENT;
```

FIG. 4A

```
ELSE IF (CPU_THROTTLING = TRUE) DECREASE CPU_THROTTLING ONE INCREMENT;
ELSE IF (CPU_THROTTLING = FALSE) DECREASE FAN SPEED ONE INCREMENT;
}

IF (CPU_TEMPERATURE = OLD_CPU_TEMP)   //STAYING THE SAME
{
   // HAS THE EXTERNAL SOUND LEVEL CHANGED?
   IF (OLD_EXTERNALSOUND NOT = EXTERNALSOUND)
      AND CPU_THROTTLING = TRUE)
      AND CPU_THROTTLING NOT = MAXIMUM);
   {
      IF (SYSTEMNOISE < EXTERNALSOUND) DECREASE CPU_THROTTLING ONE INCREMENT;
      ELSE IF (SYSTEMNOISE > EXTERNALSOUND) INCREASE CPU_THROTTLING ONE INCREMENT;
   }
}

OLD_CPU_TEMP = CPU_TEMP;
OLD_EXTERNALSOUND = EXTERNALSOUND
DELAY 100 MS;
}
```

FIG. 4B

EXTERNAL AMBIENT NOISE MONITORING TO ADAPT CONTROL OF INTERNAL SYSTEM NOISE SOURCES

FIELD OF THE INVENTION

The present invention relates computers and, more particularly, to noise sources thereof such as fans.

BACKGROUND OF THE INVENTION

In the context of computers (e.g., desktops and laptops), computational functions are typically performed by a central processing unit (CPU), such as an Intel processor. Each CPU has a clock rate, which is the fundamental rate in cycles per second (measured in hertz) at which the CPU performs its most basic operations such as adding two numbers or transferring a value from one processor register to another. Different chips on a motherboard may have different clock rates. Usually when referring to a computer, the term "clock rate" is used to refer to the speed of the CPU. The first commercial PC, the Altair (by MITS), used an Intel 8080 CPU with a clock rate of 2 MHz. The original IBM PC (c. 1981) had a clock rate of 4.77 MHz (4,770,000 cycles/second). In 1995, Intel's Pentium chip ran at 100 MHz (100 million cycles/second), and in 2002, an Intel Pentium 4 model was introduced as the first CPU with a clock rate of 3 GHz (three billion cycles/second).

As clock rates have increased, the heat generated by the CPU has increased. In other words, the need for heat dissipation increases with rising frequencies, e.g., clock rates. At first, heat sinks were thermally connected to the CPU to dissipate heat. As the need for heat dissipation has increased beyond the ability of heat sinks alone with the increase in clock rates, fans have been added as part of the cooling system for the CPU. By way of example, computers today will typically include a heat sink thermally coupled to a CPU and a fan coupled to the heat sink. Some computers will also include a fan mounted on the case of the system unit to further assist in cooling the interior of the system unit, including the CPU.

Fans, however, are a noise generator. As a CPU does not always operate at the rated clock rate, the amount of heat generated by the CPU varies, and the amount of cooling required also varies. As mentioned above, the heat generated by the CPU increases with the speed at which the CPU is operating. Thus, the greater the clock cycle at which the CPU is operating, the more cooling resources are used (e.g., fans), and the greater the operating noise. Normally, internal noise contributors are managed for noise reduction purposes on the basis of a predetermined fixed cap, with a degree of variation tied to the internal system state. Such management may take place either within the internal noise contributor itself or on a system level, i.e., on the motherboard or processor. Placement, however, impacts the sophistication of the management. Parameters relating to a current external environment of the system, however, are not taken into consideration. Another issue is often found in that while fan speeds can be reduced to lower the internal noise level, this concomitantly abets an increase in internal temperature, thus resulting in an oft undesirable tradeoff.

In view of the foregoing, a need has been recognized in connection with managing internal noise levels in a manner that reasonably takes into consideration a wider variety of parameters and factors that might affect a user's comfort level.

SUMMARY OF THE INVENTION

In accordance with at least one presently preferred embodiment of the present invention, there is broadly contemplated herein an arrangement for controlling a system generated noise level such that the same is adapted to an actual ambient noise level of the system environment. Internal noise generators will thus not run at a needlessly lowered rate than actually needed. For instance, by permitting a fan to run at a generally higher speed, the system will not needlessly undergo significant internal temperature increases. By the same token, CPU performance, to the extent that it represents a noise generator, will not be needlessly throttled.

Of course, as the external environmental noise does decrease, the system can adapt and, per normal, become quieter by throttling CPU performance and/or slowing fans. However, it will be appreciated that such adaptation will take place only to the extent actually needed in view of the state of external environmental noise, with the end result that the comfort level experienced by the user will more or less stay the same.

In summary, one aspect of the invention provides a system comprising: a CPU; a system memory in communication with the CPU; an internal system noise generator; an ambient noise measurement input which provides ambient noise measurement; a control module which acts to control the internal system noise generator responsive to the ambient noise measurement input.

Another aspect of the invention provides a method comprising: measuring ambient noise at a computer; and controlling a computer internal noise generator responsive to an ambient noise measurement; wherein the ambient noise measurement is stored in a system memory.

Furthermore, an additional aspect of the invention provides a program storage device readable by machine, tangibly embodying a program of instructions executable by the machine to perform method steps, the method comprising: measuring ambient noise at a computer; and controlling a computer internal noise generator responsive to an ambient noise measurement; wherein the ambient noise measurement is stored in a system memory.

BRIEF DESCRIPTION OF THE DRAWINGS

FIGS. 4A and 4B provide pseudo-code that can be employed with the process of FIGS. 3A and 3B.

DESCRIPTION OF THE PREFERRED EMBODIMENTS

Figure 1:
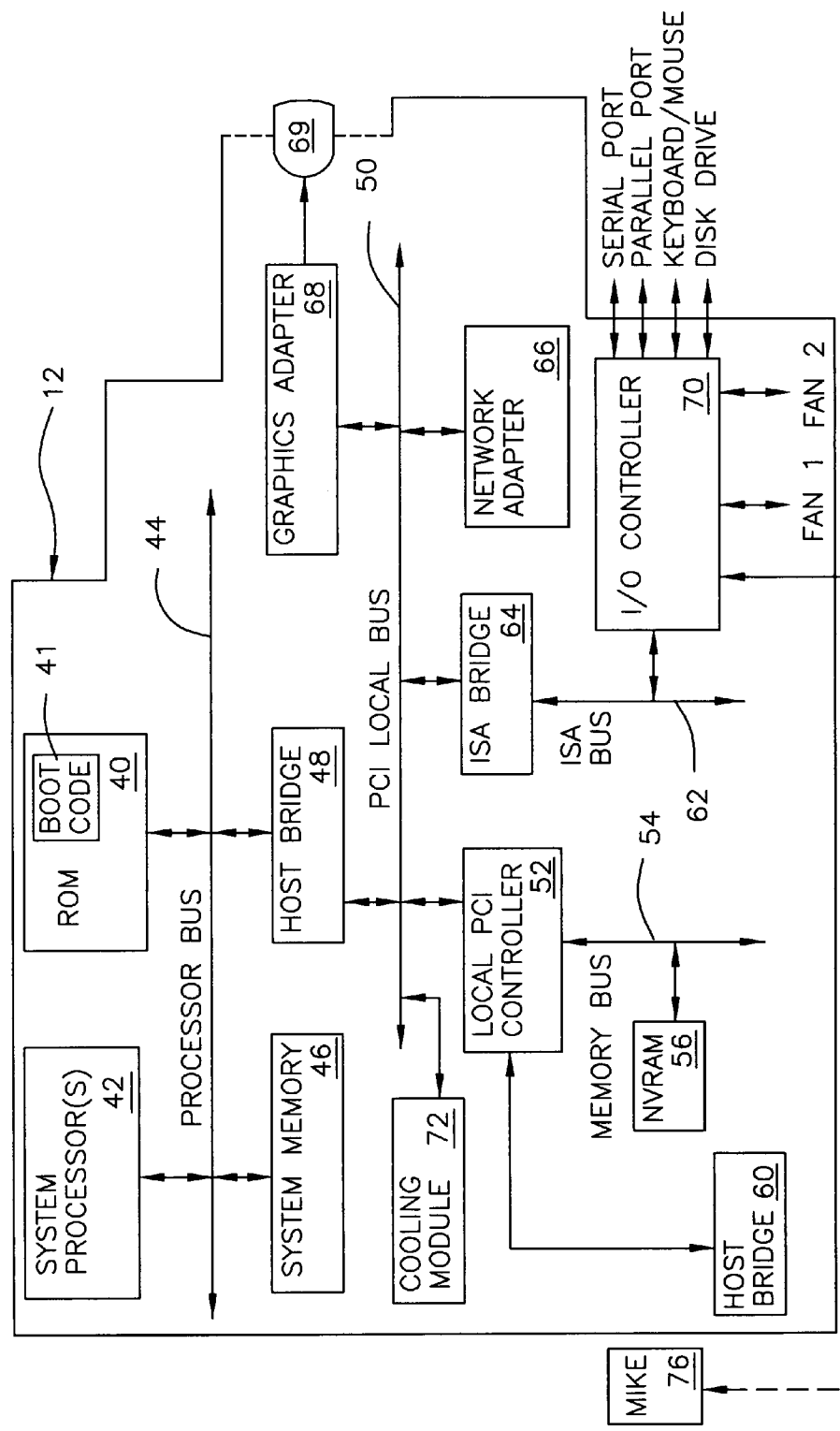
FIG. 1 is a block diagram of a computer system.

For a better understanding of the present invention, together with other and further features and advantages thereof, reference is made to the following description, taken in conjunction with the accompanying drawings, and the scope of the invention will be pointed out in the appended claims.

It will be readily understood that the components of the present invention, as generally described and illustrated in the Figures herein, may be arranged and designed in a wide variety of different configurations. Thus, the following more detailed description of the embodiments of the apparatus, system, and method of the present invention, as represented in FIGS. 1 through 4B, is not intended to limit the scope of the invention, as claimed, but is merely representative of selected embodiments of the invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Reference throughout this specification to "one embodiment" or "an embodiment" (or the like) means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals or other labels throughout. The following description is intended only by way of example, and simply illustrates certain selected embodiments of devices, systems, and processes that are consistent with the invention as claimed herein.

Referring now to FIG. 1, there is depicted a block diagram of an illustrative embodiment of a computer system 12. The illustrative embodiment depicted in FIG. 1 may be a notebook computer system, such as one of the ThinkPad® series of personal computers sold by Lenovo (US) Inc. of Purchase, N.Y. or a workstation computer, such as the Intellistation®, which are sold by International Business Machines (IBM) Corporation of Armonk, N.Y.; however, as will become apparent from the following description, the present invention is applicable to preservation of data on a disk drive by any data processing system.

As shown in FIG. 1, computer system 12 includes at least one system processor 42, which is coupled to a Read-Only Memory (ROM) 40 and a system memory 46 by a processor bus 44. System processor 42, which may comprise one of the processors produced by Intel Corporation, is a general-purpose processor that executes boot code 41 stored within ROM 40 at power-on and thereafter processes data under the control of operating system and application software stored in system memory 46. System processor 42 is coupled via processor bus 44 and host bridge 48 to Peripheral Component Interconnect (PCI) local bus 50.

PCI local bus 50 supports the attachment of a number of devices, including adapters and bridges. Among these devices is network adapter 66, which interfaces computer system 12 to LAN 10, and graphics adapter 68, which interfaces computer system 12 to display 69. Communication on PCI local bus 50 is governed by local PCI controller 52, which is in turn coupled to non-volatile random access memory (NVRAM) 56 via memory bus 54. Local PCI controller 52 can be coupled to additional buses and devices via a second host bridge 60.

Computer system 12 further includes Industry Standard Architecture (ISA) bus 62, which is coupled to PCI local bus 50 by ISA bridge 64. Coupled to ISA bus 62 is an input/output (I/O) controller 70, which controls communication between computer system 12 and attached peripheral devices such as a keyboard, mouse, and a disk drive. In addition, I/O controller 70 supports external communication by computer system 12 via serial and parallel ports.

The system may include one or more fans with adjustable fan speed. For the purposes of the present discussion, one or more fans may be understood as being controlled in accordance with a cooling module, or dedicated code for controlling one or more fans, 72. Thus, while one or more fans (e.g., "Fan 1" and "Fan 2" as shown) can be tied into the I/O controller, cooling module 72 will preferably apply a modified control protocol to the fan speed of one or more fans, which in turn will preferably govern throttling of the CPU (components 40/42/46/48), in a manner now to be described. (The one or more fans, for their part, can represent essentially any conventional fan components which affect internal system temperature. By way of a non-restrictive example, a dedicated CPU cooler may sit on top of the CPU, while a general "case fan" may be disposed essentially anywhere in the computer interior where it can cool a large portion of the interior. To the extent that reference is made herethroughout to a "fan" in the singular, this can be understood to refer to one or more fans for the purposes of the present discussion).

Preferably, as an input, measurements of the ambient (external) noise level of an environment in which the system is being used is made during system operation. Though a variety of input devices are conceivable, a microphone 76 is preferably used, connected to I/O controller 70. This mike 76 can preferably be located externally of the system 12 but may alternatively be disposed internally (yet in a manner to afford ambient noise measurement). Accordingly, ambient noise measurements (via mike 76 or other device) are used as a basis for dynamically controlling internal noise sources (such as fan 72 and CPU performance) in a manner to optimize user comfort while avoiding unnecessary compromises such as higher internal temperatures (as discussed above). It should be further understood that while FIG. 1 conveys specific hardware components that can be employed in accordance with embodiments of the present invention, the concepts discussed and contemplated herein are of course applicable to a very wide variety of computer systems and constituent conventional components.

Preferably, as part of system development, a noise calibration is undertaken. As such, noise measurements are preferably made of the system in an environment with no external noise, e.g., in a laboratory environment where a soundproof room is available. These measurements are used to create a system noise profile as a function of varying system fan speeds and/or CPU throttling, to thereby characterize a system's noise contribution to the environment in which it operates. Accordingly, such a profile may be thought of as a "zero" measurement against which combined noise levels (from the system and from ambient) may be compared in order to derive the ambient component.

CPU throttling is a widely understood phenomenon that conventionally has been controlled for a variety of reasons; essentially, throttling governs CPU performance in an inversely proportional relationship. Parameters of a clock or other timing mechanism, for instance, can be altered so as to perform such a throttling action. For example, clock speed may be decreased or wait states inserted. By way of useful background, CPU throttling, as conventionally understood, can be appreciated from a variety of publications and websites, including www.hardwaresecrets.com/article/104.

Accordingly, during real system usage, the external noise of the ambient environment in which the system is being used is continuously monitored (e.g., via mike 76, FIG. 1). An ambient noise measurement is thus determined once, with the assistance of the aforementioned profile, the contribution of internal system components is removed (in correspondence with the current fan speed). This corrected external noise value is used to dynamically optimize the system fan speed and CPU throttling setting, in a manner now to be described in further detail.

Figure 2:
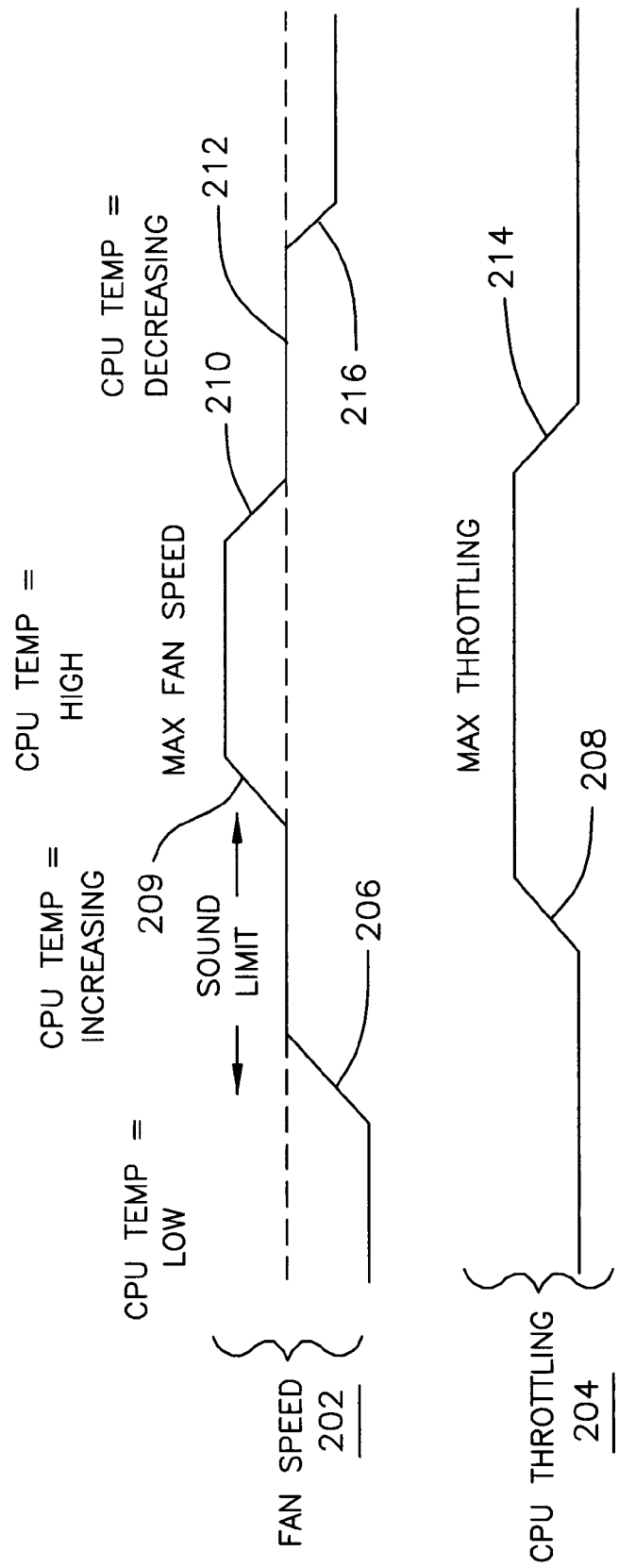
FIG. 2 graphically illustrates the effects of a protocol for governing fan speed and CPU throttling.

FIG. 2 illustrates a protocol for managing fan speed 202 and CPU throttling 204 in accordance with an embodiment of the present invention. When the CPU temperature starts to rise, fan speed is preferably increased (206) until the ambient noise limit ("sound limit") is reached. This is preferably followed by increased CPU throttling (i.e., a managed reduction in CPU performance) (208) to effect a lower CPU temperature. Should CPU temperature still rise, fan speed can be increased again (209) even if the resulting noise exceeds the ambient noise limit; the difference between the resulting noise and the ambient noise limit would be level of fan noise vs. ambient that normally would be tolerable under any other conditions. When the CPU temperature starts to fall, fan speed can be decreased (210) until the ambient noise limit is again reached (212). Throttling is then preferably decreased (214) if the CPU temperature continues to fall. If the CPU temperature decreases further still, fan speed can preferably be reduced even further (216).

Continuing onward, for as long as the CPU temperature remains the same, throttling and fan speed can be adapted to match any ambient noise changes. For instance, if ambient noise increases, then CPU throttling can be kept to a bare minimum to maximize CPU performance while allowing the fan speed to increase in compensation (in view of what will be higher CPU temperatures); the increased noise level that results can be cancelled out by ambient noise.

Figure 3A:
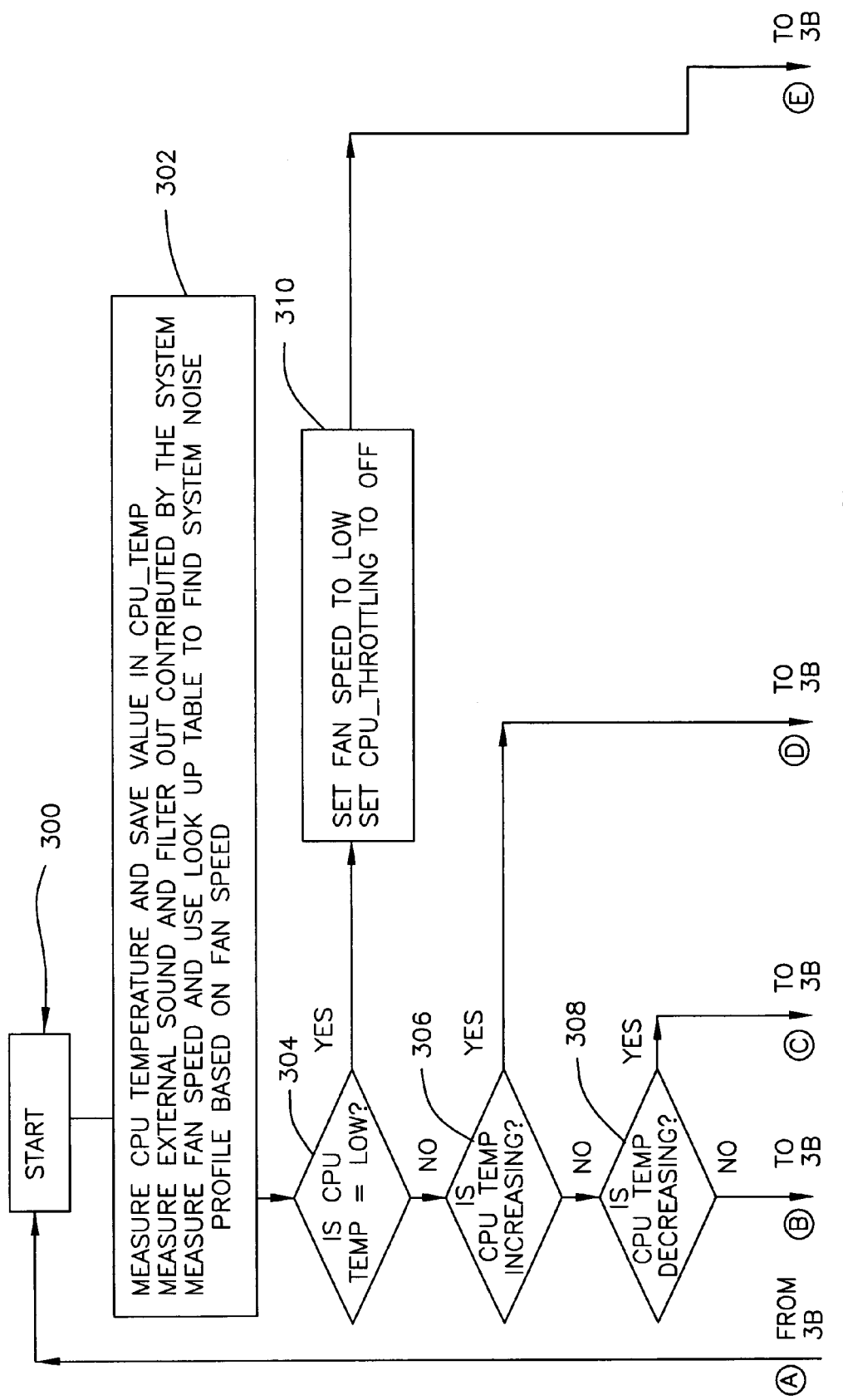
FIGS. 3A, 3B and 3C illustrate a flowchart of a noise management process.
Figure 3B:
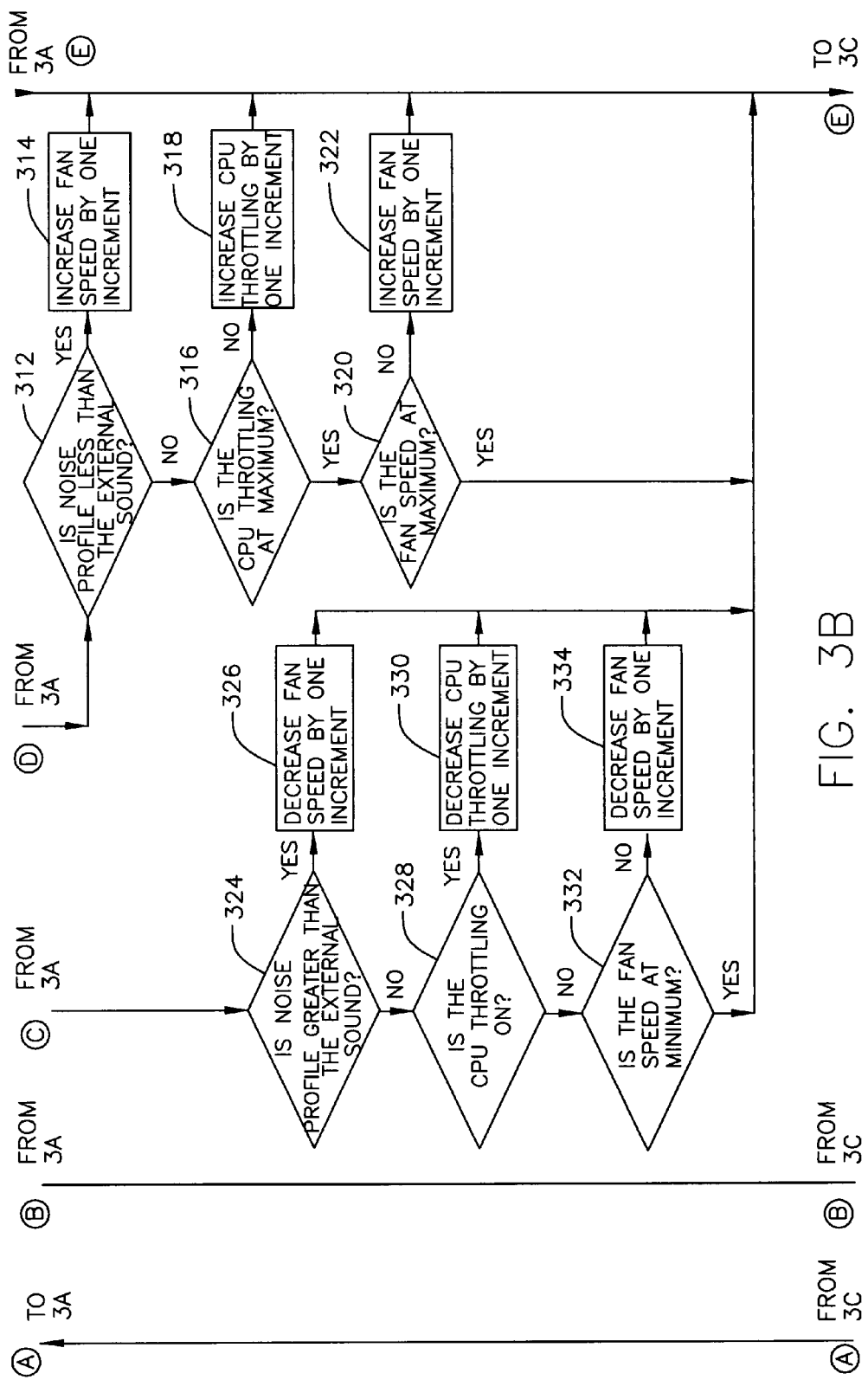
Figure 3C:
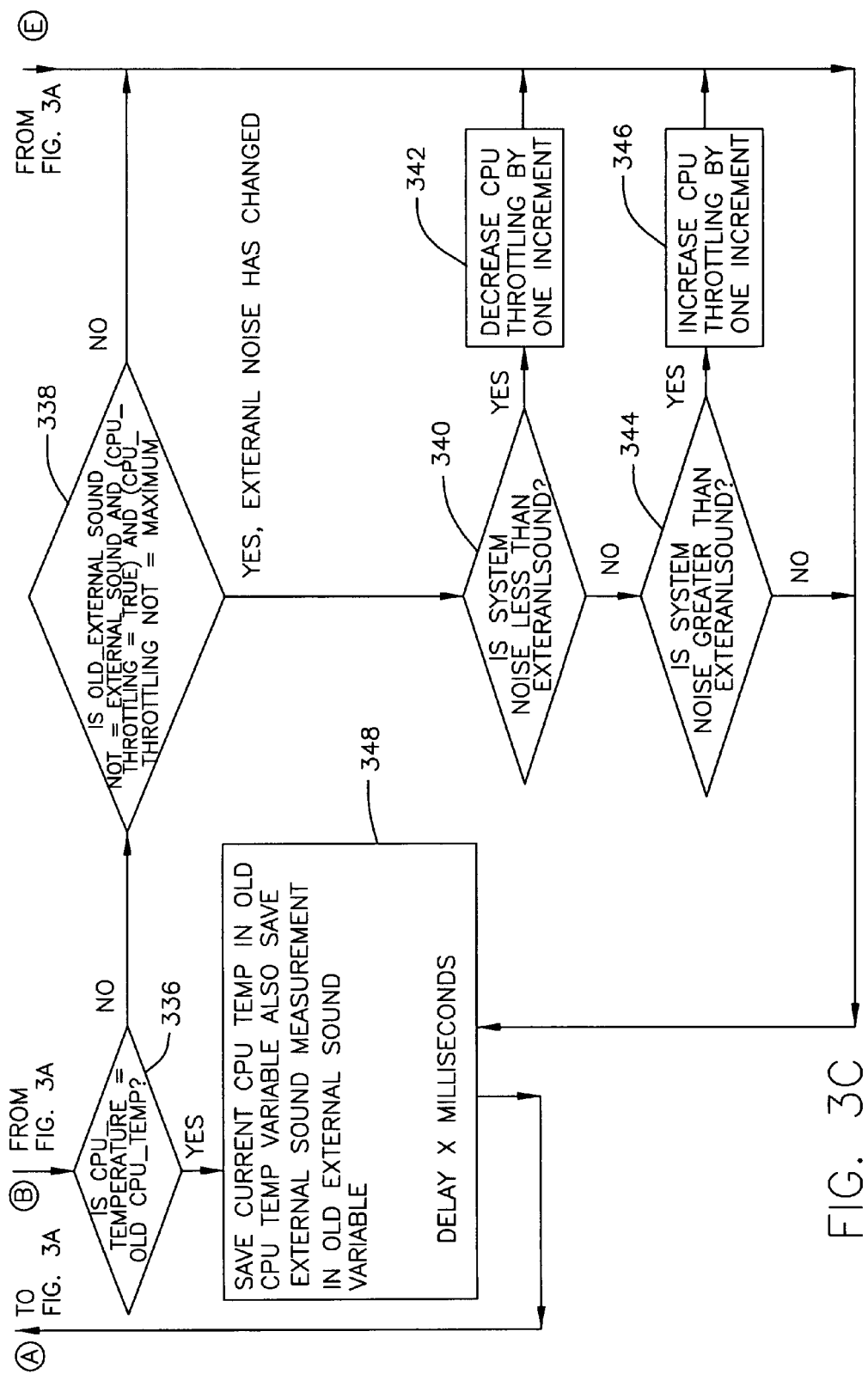

FIGS. 3A and 3B jointly illustrate an exemplary process 300 which may be carried out in accordance with at least one embodiment of the present invention, in conjunction with a program as exemplified by the pseudo-code shown in FIGS. 4A and 4B (where FIG. 4B is a continuation of FIG. 4A). Joint reference can continue to be made to FIGS. 3A-4B.

Preferably, a CPU temperature is recorded and saved, while ambient noise is measured and then adjusted by factoring out noise contributed by the system (per a calibrated noise profile as discussed earlier; the adjustment can be brought about by measuring the current fan speed and, e.g., using a lookup table to determine the system noise contribution as a function of fan speed (302).

If (304) CPU temperature is measured to be "low" (per any predetermined guidelines deemed suitable), fan speed may be set to "low" and CPU throttling may be disabled (310). The process may then progress to step 348, infra.

However, if (306) CPU temperature is deemed to be "increasing", a determination (312) is preferably made as to whether the noise profile (for current fan speed) is less than the measured ambient sound. If yes, then fan speed can be increased by one increment (314) before continuing to step 348, infra. If no (316), then it will preferably be queried as to whether CPU throttling is at a maximum. If no, then CPU throttling is preferably increased by one increment (318) before continuing to step 348, infra. If yes (320), then if fan speed is not at a maximum, fan speed is preferably increased one increment (322) before continuing to step 348, infra. Otherwise, with fan speed at a maximum, the process proceeds directly to step 348, infra.

If, at query 306, CPU temperature is determined not to be increasing, then if (308) in fact it is decreasing, then essentially a mirror image of steps 312-322 as just described takes place. In other words, if (324) the noise profile for the current fan speed is greater than the currently measured ambient noise, then decrease the fan speed by one increment (326) and move to step 348, infra. Otherwise, if (328) the CPU throttling function is on, then decrease CPU throttling by one increment and move to step 348, infra. Otherwise, if (332) the fan speed is not at a minimum, then decrease fan speed by one increment (334) and move on to step 348, infra. Otherwise, with fan speed at a minimum, the process proceeds directly to step 348, infra.

If in fact at query 308 the CPU temperature is determined not to be decreasing (i.e., is now constant), then it is queried (336) as to whether the current CPU temperature is equivalent to a previous CPU temperature; if yes, then the process continues to step 348, infra. If no, then a composite query 338 preferably determines whether ambient noise has changed. The answer will be "yes" if: a previous measured ambient noise value is not the same as a current measured ambient noise value, and CPU throttling is on, and CPU throttling is not at a maximum; the process then continues to step 340, infra. Otherwise, it continues to step 348, infra.

At step 340, if the system noise as determined by the noise profile for the current fan speed is less than the measured ambient noise, then CPU throttling is preferably decreased by one increment (342) and the process continues to step 348, infra. If "no", then at step 344, if system noise as determined by the noise profile for the current fan speed is greater than the measured ambient noise, then CPU throttling is preferably increased by one increment (346) and the process continues to step 348, infra. If "no", whereby system noise will be equivalent to measured ambient noise, then the process continues directly to step 348, infra.

At step 348, the current CPU temp is saved as an "old CPU temperature" value for future reference and comparison. Further, the current measured external noise value is saved as an "old" value for future reference and comparison. After a predetermined delay of x milliseconds, the process returns to the start (301). The delay of x milliseconds can be chosen as deemed appropriate for the application at hand.

An embodiment of the present invention may be provided as a computer program product which may include a machine-readable medium having stored thereon instructions which may be used to program a computer (or other electronic devices) to perform a process according to any of the embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, or other type of media/machine-readable medium suitable for storing electronic instructions. Moreover, an embodiment of the present invention may also be downloaded as a computer program product, wherein the program may be transferred from a remote computer to a requesting computer by way of data signals embodied in a carrier wave or other propagation medium via a communication link (e.g., a modem or network connection).

The order of steps given herein is for exemplary purposes only and should not be interpreted as limiting with respect to other embodiments which are possible using a different order of steps in implementing the inventive concepts described herein. Any ordering of steps in the claims are for the purpose of improving clarity and do not imply any particular order of steps to be taken.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A system comprising:
   a CPU;
   a system memory in communication with said CPU;
   a fan;
   an ambient noise measurement input which provides an ambient noise measurement; and a control module configured to:
   determine a corrected external noise value corresponding to an ambient noise measurement having contribution of internal system components removed by using a value obtained from a table storing a plurality of noise profile measurements corresponding to calibrated system noise values, the calibrated system noise values representing internal system noise as a function of one or more of fan speed and CPU throttling; and
   control fan speed and CPU throttling responsive to said ambient noise measurement input;
   wherein said control module acts to prompt said fan to generate less noise if a noise profile measurement for a current fan speed is greater than the corrected external noise measurement.

2. The system according to claim 1, wherein responsive to a CPU temperature increase, said control module throttles the CPU rather than increasing a fan speed if a noise profile measurement for a current fan speed is greater than the corrected external noise value.

3. The system according to claim 2, wherein responsive to a CPU temperature decrease, said control module decreases a current fan speed before decreasing CPU throttling if a system noise profile measurement for a current fan speed is greater than the corrected external noise measurement.

4. The system according to claim 3, wherein responsive to a CPU temperature decrease, said control module decreases CPU throttling if a system noise profile measurement for a current fan speed is less than the corrected external noise measurement.

5. The system according to claim 1, wherein said ambient noise measurement input comprises a microphone.

6. The system according to claim 1, wherein said system memory stores the plurality of noise profile measurements.

7. The system according to claim 1, wherein responsive to corrected external noise increase, the control module is configured to keep CPU throttling at a minimum while allowing the fan speed to increase in compensation.

8. A method comprising:
   determining a corrected external noise value corresponding to an ambient noise measurement having noise contributed by internal system components removed by using a value obtained from a table storing a plurality of noise profile measurements corresponding to calibrated system noise values, the calibrated system noise values representing internal system noise as a function of one or more of fan speed and CPU throttling; and
   controlling fan speed and CPU throttling responsive to an ambient noise measurement;
   wherein said control module acts to prompt said fan to generate less noise if a noise profile measurement for a current fan speed is greater than the corrected external noise measurement.

9. The method according to claim 8, wherein said controlling comprises responsive to a CPU temperature increase, throttling the CPU rather than increasing a fan speed if a noise profile measurement for a current fan speed is greater than the corrected external noise value.

10. The method according to claim 8, wherein said controlling comprises, responsive to a CPU temperature decrease, decreasing a current fan speed before decreasing CPU throttling if a system noise profile measurement for a current fan speed is greater than the corrected external noise measurement.

11. The method according to claim 10, wherein said controlling further comprises, responsive to a CPU temperature decrease, decreasing CPU throttling if a system noise profile measurement for a current fan speed is less than the corrected external noise measurement.

12. The method according to claim 8, wherein said ambient noise measurement is derived from a microphone.

13. The method according to claim 8, further comprising storing the plurality of noise profile measurements in a system memory.

14. The method according to claim 8, wherein said controlling further comprises, responsive to corrected external noise increase, keeping CPU throttling at a minimum while allowing the fan speed to increase in compensation.

15. A program storage device readable by machine, tangibly embodying a program of instructions executable by the machine to perform steps comprising:
   determining a corrected external noise value corresponding to an ambient noise measurement having contribution of internal system components removed by using a value obtained from a table storing a plurality of noise profile measurements corresponding to calibrated system noise values, the calibrated system noise values representing internal system noise as a function of one or more of fan speed and CPU throttling; and controlling fan speed and CPU throttling responsive to an ambient noise measurement;

wherein said control module acts to prompt said fan to generate less noise if a noise profile measurement for a current fan speed is greater than the corrected external noise measurement.

16. The program storage device according to claim 15, wherein said controlling comprises, responsive to a CPU temperature increase, throttling the CPU rather than increasing a fan speed if a noise profile measurement for a current fan speed is greater than the corrected external noise value.

17. The program storage device according to claim 16, wherein said controlling comprises, responsive to a CPU temperature decrease, decreasing a current fan speed before decreasing CPU throttling if a system noise profile measurement for a current fan speed is greater than the corrected external noise measurement.

18. The program storage device according to claim 17, wherein said controlling further comprises, responsive to a CPU temperature decrease, decreasing CPU throttling if a system noise profile measurement for a current fan speed is less than the corrected external noise measurement.

* * * * *